(12) United States Patent
Hsu et al.

(10) Patent No.: US 11,552,014 B2
(45) Date of Patent: Jan. 10, 2023

(54) SEMICONDUCTOR PACKAGE STRUCTURE AND METHOD OF MAKING THE SAME

(71) Applicant: Phoenix Pioneer Technology Co., Ltd., Hsinchu County (TW)

(72) Inventors: Che-Wei Hsu, Hsinchu County (TW); Shih-Ping Hsu, Hsinchu County (TW); Chao-Tsung Tseng, Hsinchu County (TW)

(73) Assignee: PHOENIX PIONEER TECHNOLOGY CO., LTD., Hsinchu (TW)

( * ) Notice: Subject to any disclaimer, the term of this patent is extended or adjusted under 35 U.S.C. 154(b) by 301 days.

(21) Appl. No.: 16/676,541

(22) Filed: Nov. 7, 2019

(65) Prior Publication Data
US 2020/0161234 A1 May 21, 2020

(30) Foreign Application Priority Data
Nov. 16, 2018 (TW) ................... 107140747

(51) Int. Cl.
*H01L 23/528* (2006.01)
*H01L 23/00* (2006.01)
*H01L 27/146* (2006.01)

(52) U.S. Cl.
CPC ............ *H01L 23/528* (2013.01); *H01L 24/25* (2013.01); *H01L 24/82* (2013.01); *H01L 27/14618* (2013.01); *H01L 27/14636* (2013.01); *H01L 2224/24101* (2013.01); *H01L 2224/24105* (2013.01); *H01L 2224/24155* (2013.01);
(Continued)

(58) Field of Classification Search
CPC ....... H01L 23/528; H01L 24/25; H01L 24/82; H01L 27/14618; H01L 27/14636; H01L 2224/24101; H01L 2224/24105; H01L 2224/24155; H01L 2224/2518; H01L 2224/82005; H01L 2224/82106; H01L 2224/12105; H01L 24/96; H01L 2224/04105; H01L 2224/06181;
(Continued)

(56) References Cited

U.S. PATENT DOCUMENTS

| 2005/0067680 A1* | 3/2005 | Boon ................ H01L 23/49805 257/E23.125 |
| 2008/0096321 A1* | 4/2008 | Lin .................... H01L 27/14632 257/E21.599 |

* cited by examiner

*Primary Examiner* — Ermias T Woldegeorgis
(74) *Attorney, Agent, or Firm* — McClure, Qualey & Rodack, LLP (57) ABSTRACT

A semiconductor package structure includes a chip, a conductive pillar, a dielectric layer, a first patterned conductive layer and a second patterned conductive layer. The chip has a first side with at least a first metal electrode pad and a second side with at least a second metal electrode pad. The conductive pillar, which has a first end and a second end, is disposed adjacent to the chip. The axis direction of the conductive pillar is parallel to the height direction of the chip. The dielectric layer covers the chip and the conductive pillar and exposes the first and second metal electrode pads of the chip and the first and second ends of the conductive pillar. The first patterned conductive layer is disposed on a second surface of the dielectric layer and electrically connected between the second metal electrode pad and the second end of the conductive pillar. The second patterned conductive layer is disposed on a first surface of the dielectric layer and electrically connected between the first metal electrode pad and the first end of the conductive pillar.

16 Claims, 9 Drawing Sheets

(52) U.S. Cl.
CPC ............... *H01L 2224/2518* (2013.01); *H01L 2224/82005* (2013.01); *H01L 2224/82106* (2013.01)

(58) Field of Classification Search
CPC . H01L 2224/48091; H01L 2224/73265; H01L 2224/82039; H01L 2224/8592
See application file for complete search history.

SEMICONDUCTOR PACKAGE STRUCTURE AND METHOD OF MAKING THE SAME

CROSS REFERENCE TO RELATED APPLICATIONS

This Non-provisional application claims priority under 35 U.S.C. § 119(a) on Patent Application No. 107140747 filed in Republic of China on Nov. 16, 2018, the entire contents of which are hereby incorporated by reference.

BACKGROUND

1. Technical Field

This invention relates to a package structure and its manufacturing method, in particular, to a dual-side breakover semiconductor package structure and manufacturing method thereof.

2. Description of Related Art

Chip package provides functions like the protection of integrated circuit, heat dissipation and circuit conduction, etc. With the development of wafer process technology, the efficiency request such as integrated circuit density, transmission rate and signal interference reduction is increasing, which enhance the technical requirement of the integrated circuit chip package gradually.

Chip package technology mainly consists of lead frame, wire bound and flip-chip package. Wire bound is to connect the electric connection pad on the chip to the carrier with the lead. Flip-chip package is to arrange the bump on the chip connection pad, and then flip the chip so that the bump contacts with the carrier directly.

Figure 1:
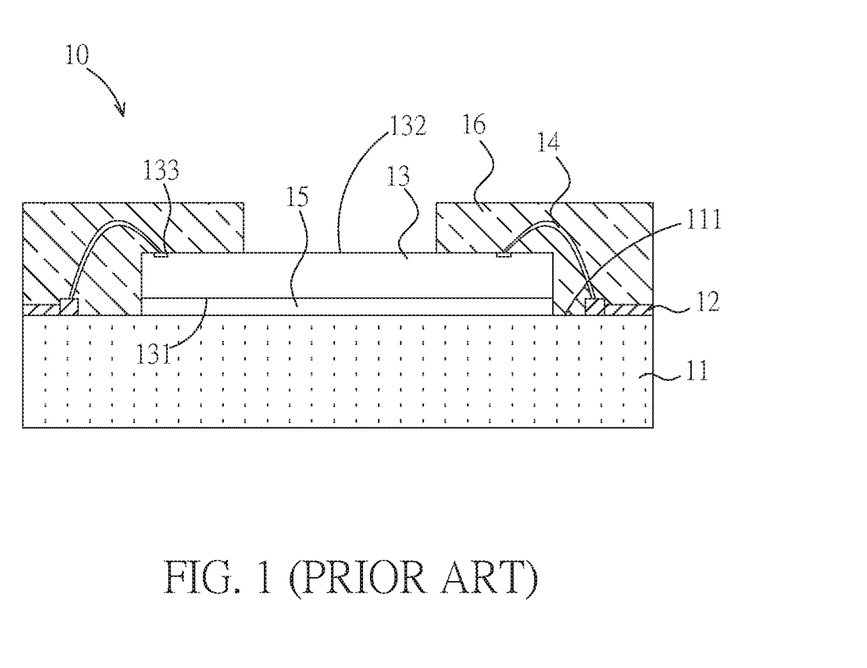
FIG. 1 is a sectional view showing a conventional chip package module made by wire bonding technology.

FIG. 1 illustrates a section diagram of chip package module 10, which is made by the well known wire bound technology. The chip package module 10 has a ceramic substrate 11, a conductive circuit layer 12, a sensing chip 13, two bonding wire 14, a heat conduction layer 15 and a package material 16. As shown in FIG. 1, the conductive circuit layer 12 and the heat conduction layer 15 are disposed on a surface 111 of the ceramic substrate 11. The sensing chip 13 is connected to the heat conduction layer 15 by its wafer backside 131, so that the heat energy generated by the sensing chip 13 can be transmitted to the ceramic substrate 11 by the heat conduction layer 15 and dissipated quickly. An end of the bonding wire 14 is connected to the bonding pad 133 of an active side 132 of the sensing chip 13, while the other end is connected to the bonding pad of the conductive circuit layer 12. The package material 16 covers part of the surface 111 of the ceramic substrate 11, the conductive circuit layer 12, the bonding wire 14 and part of the sensing chip 13.

As mentioned above, the thermal energy generated by the sensing chip 13 must be transmitted by the heat conduction layer 15 to the ceramic substrate 11, and the oxidation of the heat conduction layer 15 must be avoided, so gold or gold-containing alloys are generally chosen as the material of the heat conduction layer 15. On the other hand, the thickness of heat conduction layer 15 must be greater than 1 micron for the purpose of preferred heat dissipation effect, which is one of the reasons for the increasing cost.

Furthermore, the wire bonding technology by using bonding wire 14 will cause that the height of the chip package module 10 cannot be effectively reduced, which is applicable for light and thin products. Moreover, generally speaking, the material used for bonding wire 14 is also gold, which is also one of the reasons for the increase in cost.

SUMMARY OF THE INVENTION

Therefore, one of the purposes of the present invention is to provide a semiconductor package structure and method of making the same, which can effectively reduce the thickness of the structure.

In addition, one of the purposes of the present invention is to provide a semiconductor package structure and method of making the same, which have the advantage of low cost.

Furthermore, one of the purposes of the present invention is to provide a semiconductor package structure and method of making the same, which can achieve an effective heat dissipation effect.

To achieve the above purpose, the present invention provides a semiconductor package structure, which includes a chip, at least a conductive pillar, a dielectric layer, a first patterned conductive layer and a second patterned conductive layer. The chip has a first side and a second side, with the first side having at least a first metal electrode pad and the second side having at least a second metal electrode pad. The conductive pillar, which has a first end and a second end, is disposed adjacent to the chip. The axis direction of the conductive pillar is parallel to the height direction of the chip. The dielectric layer covers the chip and the conductive pillar, and exposes at least the first and second metal electrode pads of the chip and the first and second ends of the conductive pillar. The first patterned conductive layer is disposed on a second surface of the dielectric layer and electrically connected between the second metal electrode pad and the second end of the conductive pillar. The second patterned conductive layer is disposed on a first surface of the dielectric layer and electrically connected between the first metal electrode pad and the first end of the conductive pillar.

In one embodiment of the present invention, wherein, the chip is a sensor chip with a sensing area on the first side, and the sensing area is exposed on the dielectric layer and the second patterned conductive layer.

In one embodiment of the present invention, the semiconductor package structure further includes at least a conductive through-hole, which is disposed between the second metal electrode pad of the chip and the first patterned conductive layer. In other embodiments, the conductive through-hole is disposed between the first metal electrode pad of the chip and the second patterned conductive layer. In other embodiments, the conductive through-hole is disposed between the first metal electrode pad of the chip and the second patterned conductive layer, and between the first metal electrode pad of the chip and the second patterned conductive layer.

In one embodiment of the present invention, the semiconductor package structure includes a patterned protective layer, which covers at least part of the first patterned conductive layer. In other embodiments, the patterned protective layer covers at least part of the second patterned conductive layer and part of the chip, and exposes the sensing area of the chip. In other embodiments, the patterned protective layer covers at least part of the first patterned conductive layer, at least part of the second patterned conductive layer and part of the chip, and exposes a sensing area of the chip.

In addition, in order to achieve the above purpose, the present invention provides a manufacturing method for a semiconductor package structure, which consists of the following steps. Step 1 is to provide a carrier; step 2 is to dispose a temporary bonding layer on a surface of the carrier; step 3 is to connect a chip to the temporary bonding layer by its a first side that has a first metal electrode pad; step 4 is to dispose at least a conductive pillar to the temporary bonding layer by its a first end, and the conductive pillar is also adjacent to the chip; step 5 is to form a dielectric layer to cover the chip and the conductive pillar, and exposes at least a second metal electrode pad on a second side of the chip and a second end of the conductive pillar; step 6 is to form a first patterned conductive layer to electrically connect the second end of the conductive pillar and the second metal electrode pad of the chip; step 7 is to remove the temporary bonding layer and the carrier, so as to expose the first side of the chip and the first end of the conductive pillar; step 8 is to form a second patterned conductive layer to electrically connect the first end of the conductive pillar and the first metal electrode pad of the chip.

In one embodiment of the present invention, the manufacturing method of semiconductor package structure further includes forming at least a conductive through-hole, which is arranged between the second metal electrode pad of the chip and the first patterned conductive layer. In other embodiments, the conductive through-hole is arranged between the first metal electrode pad of the chip and the second patterned conductive layer. In other embodiments, the conductive through-hole is arranged between the first metal electrode pad of the chip and the second patterned conductive layer, and between the first metal electrode pad of the chip and the second patterned conductive layer.

In one embodiment of the present invention, wherein, the chip is a sensor chip with a sensing area on the first side, and the sensing area is exposed on the dielectric layer and the second patterned conductive layer.

In one embodiment of the present invention, the manufacturing method of semiconductor package structure further includes forming a patterned protective layer to cover at least part of the first patterned conductive layer. In other embodiments, the manufacturing method of semiconductor package structure includes forming a patterned protective layer to cover at least part of the second patterned conductive layer and part of the chip, and expose the sensing area of the chip. In other embodiments, the manufacturing method of semiconductor package structure includes forming a patterned protective layer to cover at least part of the first patterned conductive layer, at least part of the second patterned conductive layer, and part of the chip, and expose the sensing area of the chip.

Furthermore, in order to achieve the above purpose, the present invention provides the manufacturing method for another semiconductor package structure, which includes the following steps. Step 1 is to provide a carrier; step 2 is to dispose a temporary bonding layer on a surface of the carrier; step 3 is to connect a chip to the temporary bonding layer by its a first side that has a first metal electrode pad; step 4 is to dispose at least a conductive pillar to the temporary bonding layer by its a first end, and the conductive pillar is also adjacent to the chip; step 5 is to form a dielectric layer to cover the chip and the conductive pillar, and exposes at least a second metal electrode pad on a second side of the chip and a second end of the conductive pillar; step 6 is to remove the temporary bonding layer and the carrier, so as to expose the first side of the chip and the first end of the conductive pillar; step 7 is to form a first patterned conductive layer to electrically connect the second end of the conductive pillar and the second metal electrode pad of the chip; step 8 is to form a second patterned conductive layer to electrically connect the first end of the conductive pillar and the first metal electrode pad of the chip.

In one embodiment of the present invention, wherein, the steps of forming the first patterned conductive layer and the second patterned conductive layer are carried out simultaneously.

In one embodiment of the present invention, the manufacturing method of semiconductor package structure further includes forming at least a conductive through-hole, which is arranged between the second metal electrode pad of the chip and the first patterned conductive layer. In other embodiments, the conductive through-hole is arranged between the first metal electrode pad of the chip and the second patterned conductive layer. In other embodiments, the conductive through-hole is arranged between the second metal electrode pad of the chip and the first patterned conductive layer, and between the first metal electrode pad of the chip and the second patterned conductive layer.

In one embodiment of the present invention, wherein, the chip is a sensor chip with a sensing area on the first side, and the sensing area is exposed on the dielectric layer and the second patterned conductive layer.

In one embodiment of the present invention, the manufacturing method of semiconductor package structure further includes forming a patterned protective layer to cover at least part of the first patterned conductive layer. In other embodiments, the manufacturing method of semiconductor package structure includes forming a patterned protective layer to cover at least part of the second patterned conductive layer and part of the chip, and expose the sensing area of the chip. In other embodiments, the manufacturing method of semiconductor package structure includes forming a patterned protective layer to cover at least part of the first patterned conductive layer, at least part of the second patterned conductive layer, and part of the chip, and expose the sensing area of the chip.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DETAILED DESCRIPTION

Reference will now be made to the drawings to describe various inventive embodiments of the present disclosure in detail, wherein like numerals refer to like elements throughout.

Figure 2:
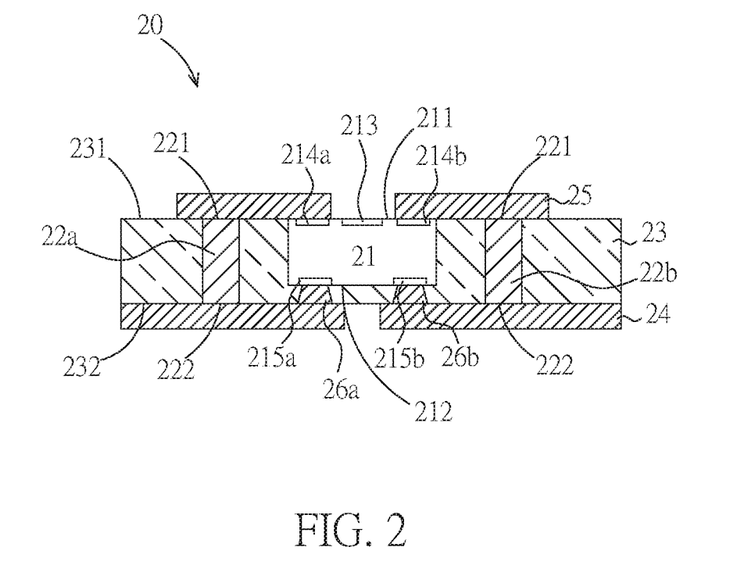
FIG. 2 is a sectional view showing a semiconductor package structure according to the preferred embodiment of the present invention.

FIG. 2 is a section diagram of the semiconductor package structure 20 in the preferred embodiment of the present invention. As shown in FIG. 2, the semiconductor package structure 20 includes a chip 21, two conductive pillars 22a and 22b, a dielectric layer 23, a first patterned conductive layer 24, a second patterned conductive layer 25 and two conductive through-holes 26a and 26b.

The chip 21 is a sensing chip, such as an image sensing chip. In this embodiment, a 3D sensing chip with three-dimensional image sensing function is illustrated as an example. The chip 21 has a first side 211 and a second side 212, in which the first side 211 is the active side of the chip 21 and the second side 212 is the back side of the chip. The first side 211 of the chip 21 has a sensing area 213 and two first metal electrode pads 214a and 214b, in which the first metal electrode pads 214a and 214b are positioned at the outer edge of the sensing area 213, respectively. The second side 212 of the chip 21 also has two second metal electrode pads 215a and 215b.

The first metal electrode pads 214a and 214b as well as the second metal electrode pads 215a and 215b can be taken as the positive and negative poles of the chip 21, or P or N poles of the chip respectively. In addition, the metal electrode pads mentioned above are, for example, aluminum metal electrode pads, gold metal electrode pads, copper metal electrode pads or other conductive metal electrode pads. Furthermore, if the metal electrode pad is gold, its thickness is approximately less than 0.2 micron.

The conductive pillars 22a and 22b are copper pillars, copper alloy pillars or other conductive metal pillars formed by non-electroplating process, which are adjacent to the chip 21, and have a first end 221 and a second end 222, respectively. The height of the conductive pillars 22a and 22b is higher than that of the chip 21 and the axis direction of the conductive pillars 22a and 22b is parallel to that of the chip 21. In other words, conductive pillars 22a and 22b are positioned adjacent to the chip 21, respectively.

The dielectric layer 23 has a first surface 231 and a second surface 232, and it covers the chip 21 and the conductive pillars 22a and 22b. The first metal electrode pads 214a and 214b, the sensing area 213 and the first ends 221 of the conductive pillars 22a and 22b are selectively exposed to the first surface 231 of the dielectric layer 23, while the second metal electrode pads 215a and 215b and the second ends 222 of the conductive pillars 22a and 22b are selectively exposed to the second surface 232 of the dielectric layer 23. In short, the first metal electrode pads 214a and 214b, the sensing area 213, the first ends 221 of the conductive pillars 22a and 22b, the second metal electrode pads 215a and 215b and the second end 222 of the conductive pillars 22a and 22b are selectively not covered by the dielectric layer 23.

The dielectric layer 23 is made of insulating materials like novolac-based resin, epoxy-based resin or silicone-based resin. In addition, the dielectric layer 23 can also be high filler content dielectric material such as molding compound with the epoxy as the base material, the proportion of epoxy resin in the whole molding compound is about 8%-12%, and mingle with fillers accounting for about 70%-90% of the total proportion. Among them, the fillers can be silica and alumina, which will improve mechanical strength, reduce linear thermal expansion coefficient, increase heat conduction and water resistance, and reduce excessive glue.

The conductive through-holes 26a and 26b are disposed in the dielectric layer 23 at the position corresponding to the second metal electrode pads 215a and 215b. Among them, the conductive through-holes 26a and 26b are so-called blind via in the field of semiconductor technology, which are formed by making holes in the dielectric layer 23, and then filling with or electroplating with metals like copper for the electric conduction of the second metal electrode pads 215a and 215b.

The first patterned conductive layer 24 is disposed on a second surface 232 of the dielectric layers 23, which is to electrically connect the second end 222 of the conductive pillar 22a to the second metal electrode pad 215a of the chip 21 by the conductive through-hole 26a. In addition, the first patterned conductive layer 24 is to electrically connect the second end 222 of the conductive pillar 22b to the second metal electrode pad 215b of the chip 21 by the conductive through-hole 26b.

As mentioned above, the first metal electrode pad 214a of the chip 21 can form an electrical circuit with the second metal electrode pad 215a by the second patterned conductive layer 25, the conductive pillar 22a, the first patterned conductive layer 24 and the conductive through-hole 26a; on the other hand, the first metal electrode pad 214b of the chip 21 can form an electrical circuit with the second metal electrode pad 215b by the second patterned conductive layer 25, the conductive pillar 22b, the first patterned conductive layer 24 and the conductive through-hole 26b. Accordingly, the semiconductor package structure provided by the present invention can form a dual-side breakover package structure of the chip, and the thermal energy generated by the chip can be quickly dissipated to outside via the metal conductive through-hole, the patterned conductive layers and the conductive pillars.

Hereof, the more is in other embodiments, the conductive through-hole can also be disposed in the dielectric layer at the position corresponding to the first metal electrode pad of the chip, and can form a conductive circuit with the second metal electrode pad of the chip by the second patterned conductive layer, the conductive pillar, the first patterned conductive layer and the conductive through-hole electrically connected to the second metal electrode pad.

Next, refer to FIGS. 3A to 3I to illustrate the first manufacturing method of the semiconductor package structure in the preferred embodiment of the present invention.

Figure 3A:
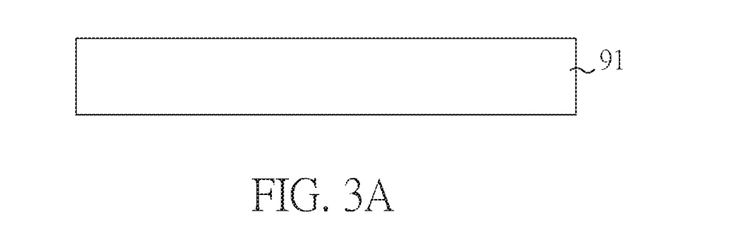
FIG. 3A through FIG. 3I are schematic diagrams showing the first manufacturing method for semiconductor package structure according to the preferred embodiment of the present invention.

As shown in FIG. 3A, a carrier 91 is provided, which can be either a metal plate or an insulating plate. In particular, only the dies or chips formed in a single wafer can be packaged simultaneously in the conventional wafer type process, which is time-consuming and has many process limitations. Compared with that, the present invention uses a panel type package process, in which the area of the carrier 91 is a plurality times that of a single wafer. Accordingly, the carrier 91 of the present invention can carry out the package process of all chips (dies) cut from a plurality of wafers at the same time so as to effectively save the manufacturing time.

Figure 3B:
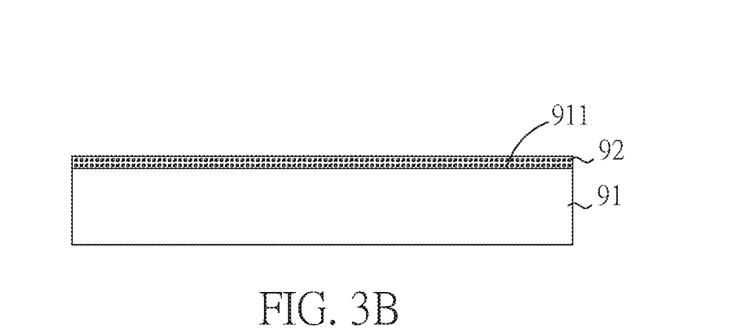

As shown in FIG. 3B, a temporary bonding layer 92 is disposed on a surface 911 of the carrier 91. Wherein, the temporary bonding layer 92 can be made of polymer viscous material, viscous detachable film or other viscous material.

Figure 3C:
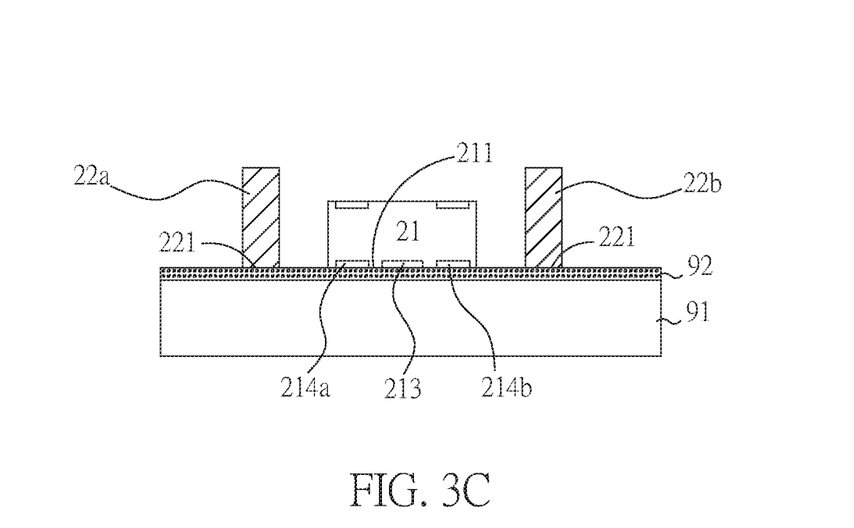

As shown in FIG. 3C, the chip 21 cut from the wafer is connected to the temporary bonding layer 92 by its first side 211 that has the first metal electrode pads 214a and 214b, and the sensing area 213. In this embodiment, the first side 211 is the active side of the chip 21, so the connection mode is called "Face-down". In addition, the present embodiment takes a single chip as an example to illustrate that in practice, a plurality of chips can be connected to the temporary bonding layer simultaneously or in stages.

As shown in FIG. 3C, the conductive pillars 22a and 22b are connected to the temporary bonding layer 92 by the first end 221, and they are disposed adjacent to the chip 21. The conductive pillars 22a and 22b are conductive metal pillars, such as copper pillars or copper alloy pillars, which can be pre-formed by non-electroplating process.

If the disposing sequence of the chip 21 and conductive pillars 22a and 22b are not restrictive, in other words, the conductive pillars 22a and 22b can be connected to the temporary bonding layer 92 before the chip 21 is connected to the temporary bonding layer 92.

Figure 3D:
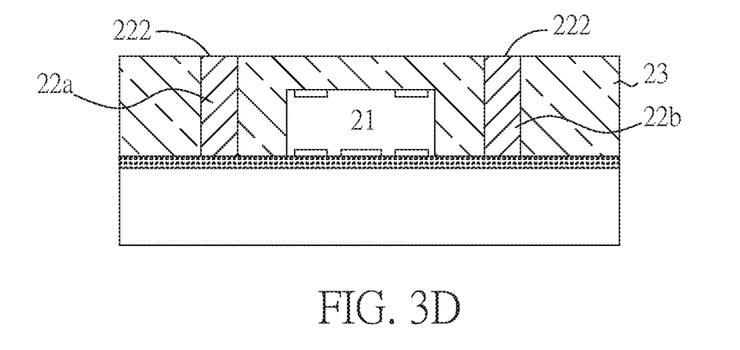

As shown in FIG. 3D, the dielectric layer 23 covers the chip 21 and conductive pillars 22a and 22b, then the surface of the dielectric layer 23 is ground with the grinding process to expose the second end 222 of the conductive pillars 22a and 22b.

Figure 3E:
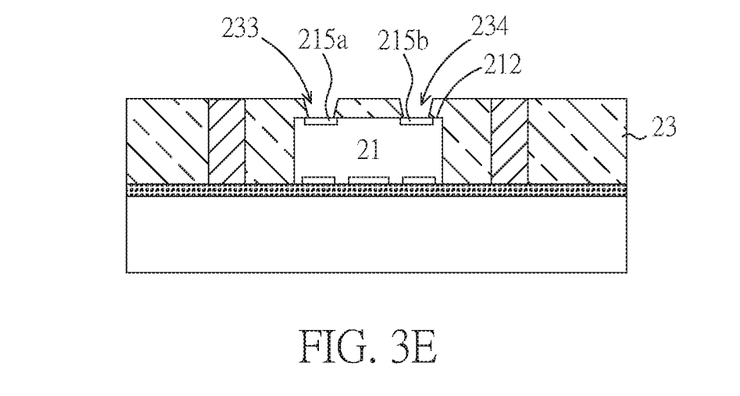

As shown in FIG. 3E, the holes 233 and 234 are formed in the dielectric layer 23 at the position corresponding to the second metal electrode pads 215a and 215b, so as to expose the second metal electrode pads 215a and 215b on the second side 212 of the chip 21.

Figure 3F:
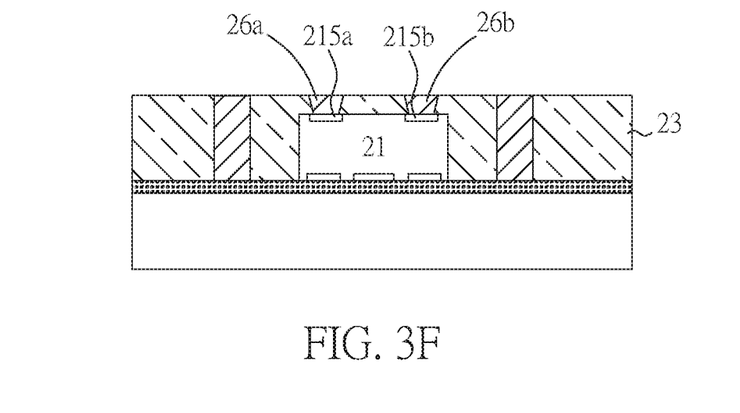

As shown in FIG. 3F, the conductive through-holes 26a and 26b are formed by filling metal materials with the electroplating or other process respectively in the holes 233 and 234.

Figure 3G:
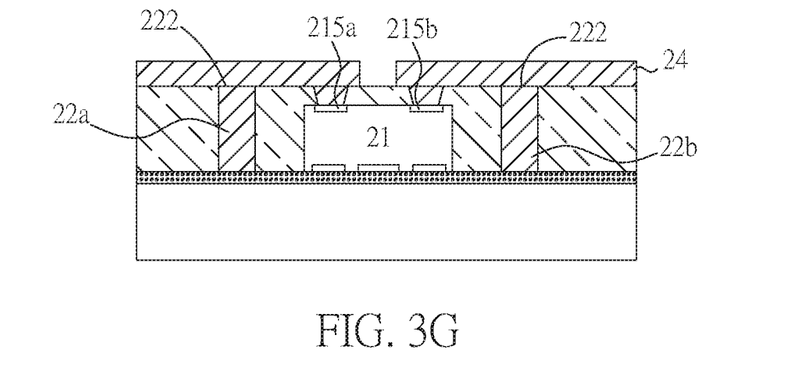

As shown in FIG. 3G, the first patterned conductive layer 24 is formed to electrically connect the second end 222 of the conductive pillars 22a and 22b, and the second metal electrode pads 215a and 215b of the chip 21. The first patterned conductive layer 24 may include conductive metal materials such as copper, silver, nickel or alloys of their composition and it can be formed with the procedure of exposure and development by microlithography etching technology in conjunction with additional photoresistive layer (not shown in the figure) and then with the electroplating process. However, in the manufacturing method of the present invention, the circuit layout of the first patterned conductive layer 24 is not limited to the above-mentioned electrical connection mode. In other embodiments, each part of the first patterned conductive layer 24 may also have other electrical connection modes, thus having different circuit layout. Alternatively, for the first patterned conductive layer 24 in the same embodiment, different sections at different positions will also present different electrical connection modes.

It is to be explained that in other embodiments, as shown in FIGS. 3F and 3G, the forming of conductive through-holes 26a and 26b and first patterned conductive layer 24 can be completed simultaneously in the same step by microlithography etching technology in conjunction with electroplating process.

Figure 3H:
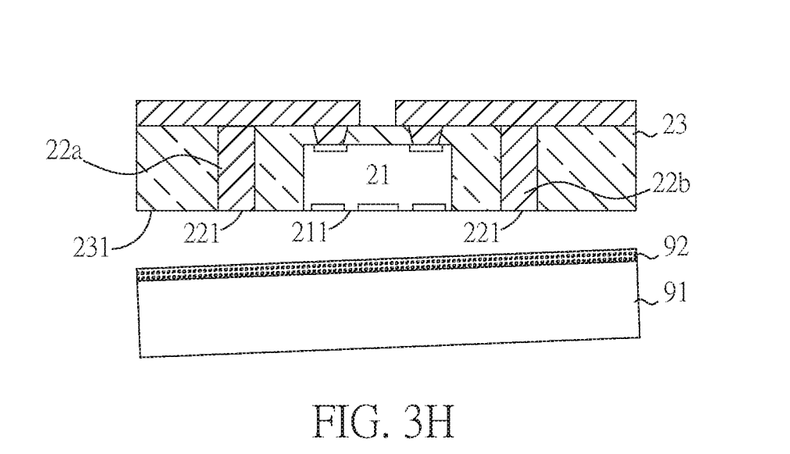

As shown in FIG. 3H, the temporary bonding layer 92 and the carrier 91 are removed to expose the first side 211 of the chip 21, the first end 221 of conductive pillars 22a and 22b, and the first surface 231 of the dielectric layer 23, and form a semi-finished package. After the temporary bonding layer 92 and the carrier 91 are removed, the semi-finished package can be selectively flipped so that the first side 211 of the chip 21 is upwards for subsequent processing. However, whether to flip depends on the process requirement and is not a necessary step.

Figure 3I:
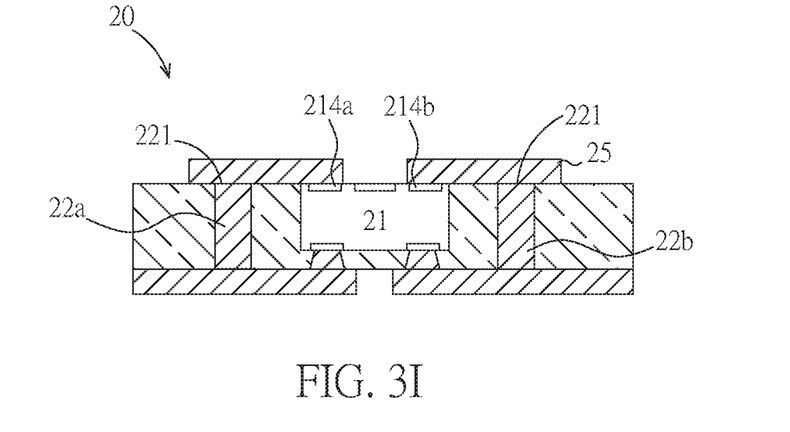

As shown in FIG. 3I, the second patterned conductive layer 25 is formed to electrically connect the first end 221 of the conductive pillars 22a and 22b and the first metal electrode pads 214a and 214b of the chip 21, thus the main semiconductor package structure 20 is completed. In this embodiment, the material and manufacturing process of the second patterned conductive layer 25 are the same or similar as that of the first patterned conductive layer 24.

Following, refer to FIGS. 3A to 3E and 4A to 4D to illustrate the second manufacturing method of the semiconductor package structure in the preferred embodiment of the present invention, in which the same components are described with the same component symbols. In addition, in the present embodiment, the steps from FIGS. 3A to 3E are the same as those described above.

Figure 4A:
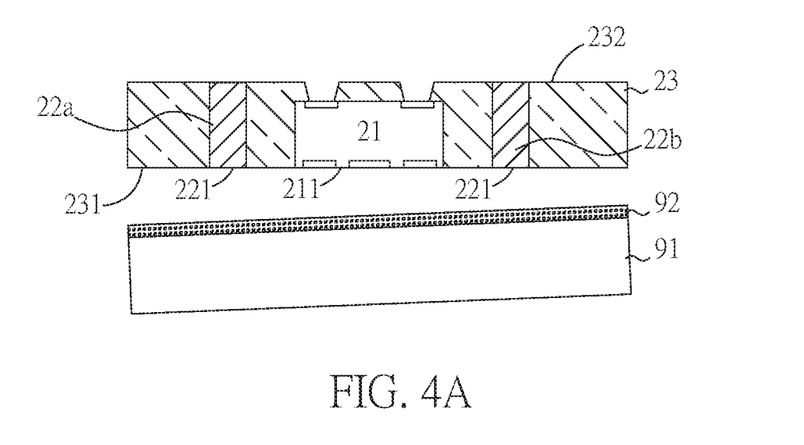
FIG. 4A through FIG. 4D are schematic diagrams showing the second manufacturing method for semiconductor package structure according to the preferred embodiment of the present invention.

Referring to FIG. 4A, the temporary bonding layer 92 and the carrier 91 are removed after laser drilling as shown in FIG. 3E to expose the first side 211 of the chip 21, the first end 221 of conductive pillars 22a and 22b, and the first surface 231 and the second surface 232 of the dielectric layer 23.

Figure 4B:
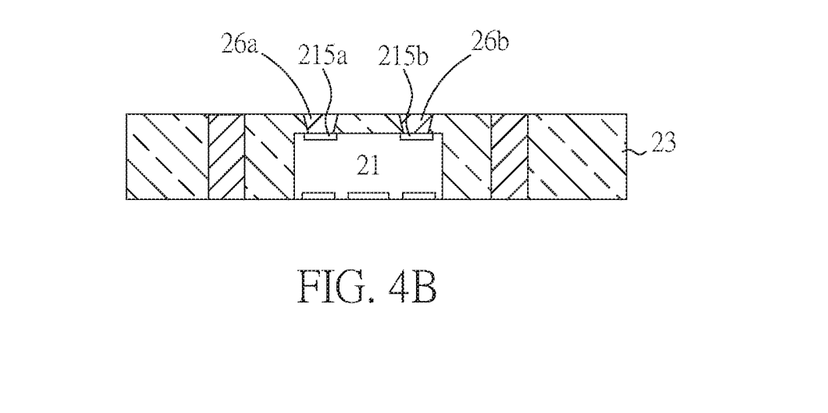

As shown in FIG. 4B, the conductive through-holes 26a and 26b are formed by filling metal materials with the electroplating or other process respectively in the holes 233 and 234.

Figure 4C:
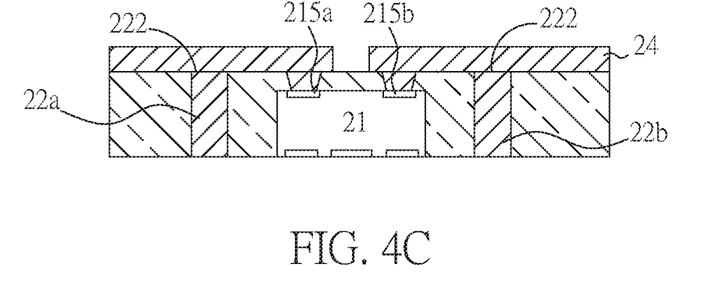

As shown in FIG. 4C, the first patterned conductive layer 24 is formed to electrically connect the second end 222 of the conductive pillars 22a and 22b, and to electrically connect the second metal electrode pads 215a and 215b of the chip 21 by the conductive through-holes 26a and 26b. The execution procedure of the first patterned conductive layer 24 is the same as that of the preceding embodiment.

Same as the above embodiment, in other embodiments as shown in FIGS. 4B and 4C, the forming of conductive through-holes 26a and 26b and the first patterned conductive layer 24 can be completed simultaneously in the same step by the microlithography etching technology in conjunction with the electroplating process.

Figure 4D:
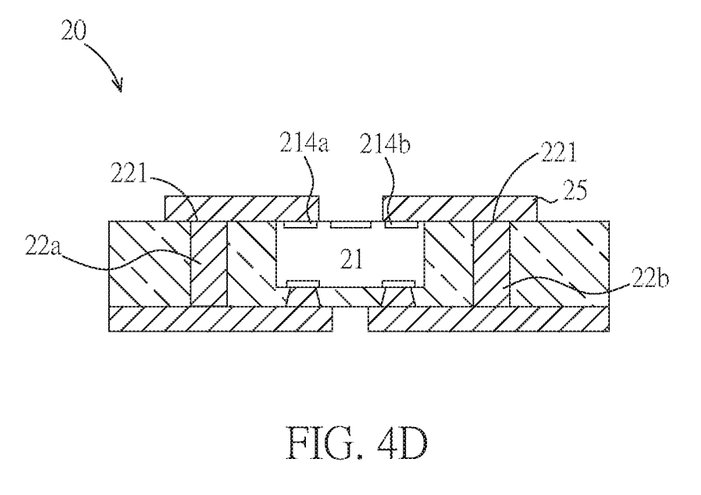

As shown in FIG. 4D, the second patterned conductive layer 25 is formed to electrically connect the first end 221 of the conductive pillars 22a and 22b and the first metal electrode pads 214a and 214b of the chip 21, thus the main semiconductor package structure 20 is completed, the material and manufacturing process of the second patterned conductive layer 25 are the same or similar as that of embodiment above.

In particular, the steps shown in FIGS. 4C and 4D can be carried out simultaneously depending on different process technology. In other words, the first patterned conductive layer 24 and the second patterned conductive layer 25 can be completed simultaneously to save more processing time. It is further explained that the conductive through-holes 26a and 26b, the first patterned conductive layer 24 and the second patterned conductive layer 25 can be completed in the same step to save more processing time.

Figure 5A:
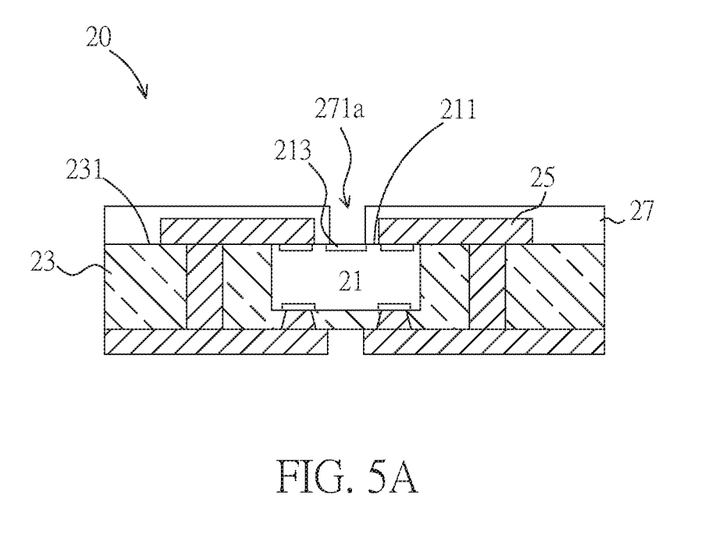
FIG. 5A is a sectional view showing the semiconductor package structure having a first patterned protective layer.
Figure 5B:
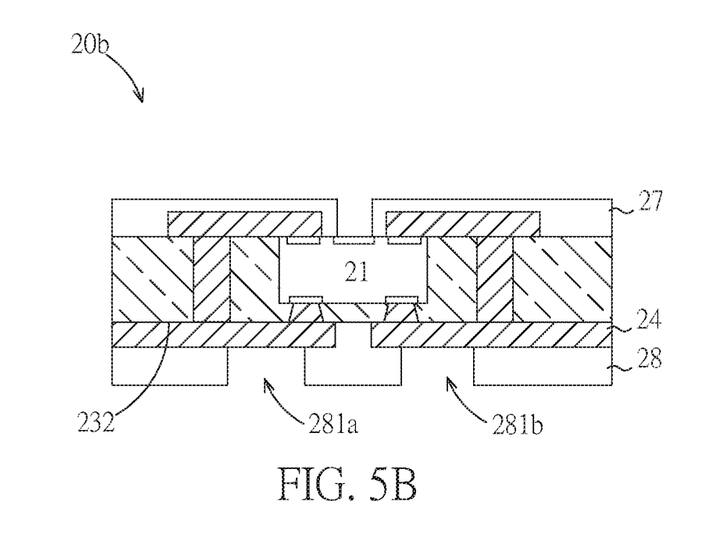
FIG. 5B is a sectional view showing the semiconductor package structure having a second patterned protective layer.

Following the above, the semiconductor package structure in the preferred embodiment of the present invention can also include the protective layer, which can reduce the risk of oxidation of the semiconductor package structure or expand the application scope of the semiconductor package structure. Refer to FIGS. 5A and 5B below for further illustration of the variation aspect in the semiconductor package structures having the patterned protective layers.

As shown in FIG. 5A, the difference between the semiconductor package structure 20a and the aforementioned semiconductor package structure 20 is that the semiconductor package structure 20a includes the first patterned protective layer 27; its manufacturing method can be followed to the steps in FIG. 3I or FIG. 4D. The first patterned protective layer 27 can be formed by microlithography etching technology, which covers the first surface 231 of at least part of the dielectric layer 23, the second patterned conductive layer 25 and the first side 211 of part of the chip 21. In particular, since the chip 21 of this embodiment is a 3D sensing chip, so the first patterned protective layer 27 is not formed within the sensing area 213. In other words, the first patterned protective layer 27 has an opening 271a at the position corresponding to the sensing area 213 of the chip 21. In addition, in other embodiments, the region corresponding to the sensing area 213 can be filled with high transparency material (not shown in the figure) with a transmittance of light over 70% to protect the sensing area 213 of the chip 21.

Furthermore, as shown in FIG. 5B, the difference between the semiconductor package structure 20b and the aforementioned semiconductor package structure 20a is that the semiconductor package structure 20b includes the second patterned protective layer 28, which is same as the first patterned protective layer 27 that can be formed by microlithography etching technology, and covers the second surface 232 of at least part of the dielectric layer 23 and part of the first patterned conductive layer 24. In the present embodiment, the second patterned protective layer 28 has two openings 281a and 281b to expose part of the first patterned conductive layer 24. Wherein, the first patterned conductive layer 24 exposed can be used as an electrical connection pad (or bonding pad).

In other embodiments, according to different applications, also only the second patterned protective layer 28 can be formed to cover the second surface 232 of at least part of the dielectric layer 23 and part of the first patterned conductive layer 24, without the first patterned protective layer 27.

In addition, after completing the process of each stage mentioned above, the cutting single process can be selectively carried out; that is to say, a plurality of panel type semiconductor package structure aggregation is cut into single semiconductor package structure. In the follow-up, the conductive bumps (or solder) can be disposed at the openings 281a and 281b by welding process to form electrical connections with other carriers, substrates, circuit boards or electrical components (not shown in the figure).

Figure 6A:
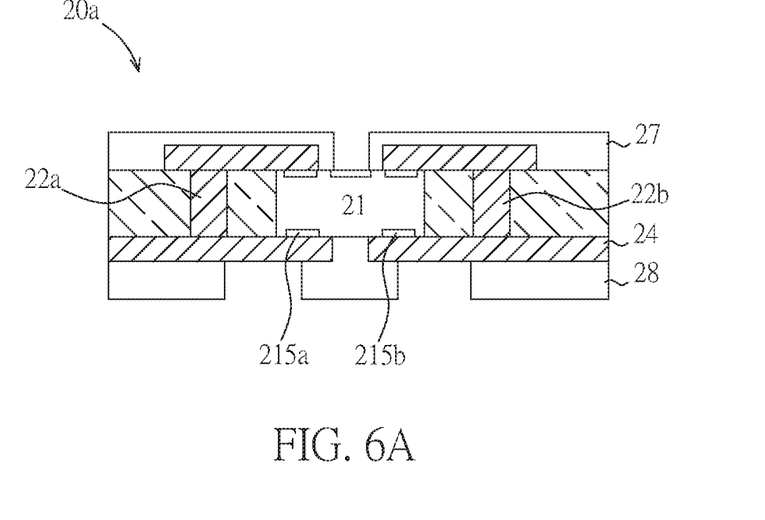
FIG. 6A is a sectional view showing the semiconductor package structure according to another embodiment of the present invention.
Figure 6B:
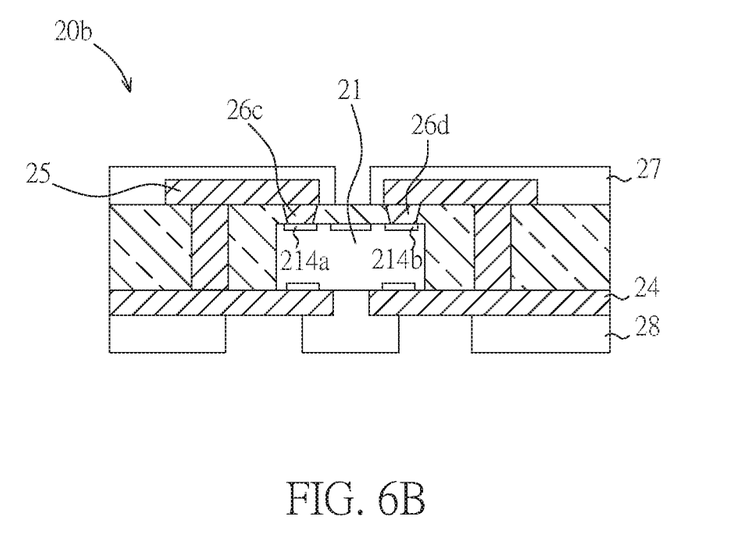
FIG. 6B is a sectional view showing the semiconductor package structure according to furthermore embodiment of the present invention.

Please refer to FIGS. 6A and 6B for a brief description of other implementation variation aspects of the semiconductor package structure of the present invention. As shown in FIG. 6A, the difference between the semiconductor package structure 20a and the above-mentioned embodiments is that the second metal electrode pads 215a and 215b of the chip 21 are directly in contact with the first patterned conductive layer 24. In other words, the steps of forming the conductive through-holes 26a and 26b in the above embodiments can be omitted.

As shown in FIG. 6B, the difference between the semiconductor package structure 20b and the above embodiments is that the first metal electrode pads 214a and 214b of chip 21 are electrically connected to the second patterned conductive layer 25 by the conductive through-holes 26c and 26d. For example, the conductive through holes 26c and 26D can be formed with electroplating process after disposed on the temporary bonding layer 92 as shown in FIG. 3B above.

In addition, in other embodiments, the first patterned protective layer 27 and/or the second patterned protective layer 28 can selectively cover the first patterned conductive layer 24 or the second patterned conductive layer 25 of FIGS. 6A and 6B, but with several different implementation variation aspects.

In summary, compared with prior art, the semiconductor package structure of the present invention has the following characteristics: (1) The ceramic substrate and the package structure using wire bound technology are omitted, so a thinner structure can be provided. (2) The cost of package structure can be reduced by eliminating the use of gold bonding wire and heat conduction layer. (3) Conductive pillars are made by placing premade copper pillars, copper alloy pillars or other conductive metal pillars on the temporary bonding layers, which can improve the size limitation of traditional electroplating process, and improve the electrical quality which are affected by poor uniformity caused by blowhole during electroplating. (4) The output speed can be increased with one-time processing for the number of chips (dies) more than a single wafer by using the panel type process.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:
1. A manufacturing method for a semiconductor package structure, comprising:
   providing a carrier;
   disposing a temporary bonding layer on a surface of the carrier;
   connecting a chip to the temporary bonding layer by its a first side that has a first metal electrode pad;
   disposing at least a conductive pillar to the temporary bonding layer by its a first end, and the conductive pillar is also adjacent to the chip;
   forming a dielectric layer to cover the chip and the conductive pillar, and exposes at least a second metal electrode pad on a second side of the chip and a second end of the conductive pillar;
   forming a first patterned conductive layer to electrically connect the second end of the conductive pillar and the second metal electrode pad of the chip;
   removing the temporary bonding layer and the carrier, so as to expose the first side of the chip and the first end of the conductive pillar; and
   forming a second patterned conductive layer to electrically connect the first end of the conductive pillar and the first metal electrode pad of the chip.

2. The manufacturing method of claim 1, further comprising:
   forming at least a conductive through-hole, which is arranged between the second metal electrode pad of the chip and the first patterned conductive layer and/or arranged between the first metal electrode pad of the chip and the second patterned conductive layer.

3. The manufacturing method of claim 2, wherein the chip is a sensor chip with a sensing area on the first side, and the sensing area is exposed on the dielectric layer and the second patterned conductive layer.

4. The manufacturing method of claim 3, further comprising:
forming a patterned protective layer to cover at least part of the first patterned conductive layer and/or to cover at least part of the second patterned conductive layer and part of the chip, and expose the sensing area of the chip.

5. The manufacturing method of claim 2, further comprising:
forming a patterned protective layer to cover at least part of the first patterned conductive layer and/or to cover at least part of the second patterned conductive layer and part of the chip.

6. The manufacturing method of claim 1, wherein the chip is a sensor chip with a sensing area on the first side, and the sensing area is exposed on the dielectric layer and the second patterned conductive layer.

7. The manufacturing method of claim 6, further comprising:
forming a patterned protective layer to cover at least part of the first patterned conductive layer and/or to cover at least part of the second patterned conductive layer and part of the chip, and expose the sensing area of the chip.

8. The manufacturing method of claim 1, further comprising:
forming a patterned protective layer to cover at least part of the first patterned conductive layer and/or to cover at least part of the second patterned conductive layer and part of the chip.

9. A manufacturing method for a semiconductor package structure, comprising:
providing a carrier;
disposing a temporary bonding layer on a surface of the carrier;
connecting a chip to the temporary bonding layer by its a first side that has a first metal electrode pad;
disposing at least a conductive pillar to the temporary bonding layer by its a first end, and the conductive pillar is also adjacent to the chip;
forming a dielectric layer to cover the chip and the conductive pillar, and exposes at least a second metal electrode pad on a second side of the chip and a second end of the conductive pillar;
removing the temporary bonding layer and the carrier, so as to expose the first side of the chip and the first end of the conductive pillar;
forming a first patterned conductive layer to electrically connect the second end of the conductive pillar and the second metal electrode pad of the chip;
forming a second patterned conductive layer to electrically connect the first end of the conductive pillar and the first metal electrode pad of the chip; and
wherein the steps of forming the first patterned conductive layer and the second patterned conductive layer are carried out simultaneously.

10. The manufacturing method of claim 9, further comprising:
forming at least a conductive through-hole, which is arranged between the second metal electrode pad of the chip and the first patterned conductive layer and/or arranged between the first metal electrode pad of the chip and the second patterned conductive layer.

11. The manufacturing method of claim 10, wherein the chip is a sensor chip with a sensing area on the first side, and the sensing area is exposed on the dielectric layer and the second patterned conductive layer.

12. The manufacturing method of claim 11, further comprising:
forming a patterned protective layer to cover at least part of the first patterned conductive layer and/or to cover at least part of the second patterned conductive layer and part of the chip, and expose the sensing area of the chip.

13. The manufacturing method of claim 10, further comprising:
forming a patterned protective layer to cover at least part of the first patterned conductive layer and/or to cover at least part of the second patterned conductive layer and part of the chip.

14. The manufacturing method of claim 9, wherein the chip is a sensor chip with a sensing area on the first side, and the sensing area is exposed on the dielectric layer and the second patterned conductive layer.

15. The manufacturing method of claim 14, further comprising:
forming a patterned protective layer to cover at least part of the first patterned conductive layer and/or to cover at least part of the second patterned conductive layer and part of the chip, and expose the sensing area of the chip.

16. The manufacturing method of claim 9, further comprising:
forming a patterned protective layer to cover at least part of the first patterned conductive layer and/or to cover at least part of the second patterned conductive layer and part of the chip.

* * * * *